United States Patent
Xu et al.

(10) Patent No.: US 11,923,879 B2
(45) Date of Patent: Mar. 5, 2024

(54) RADIO UNIT FOR UNSYNCHRONIZED TDD MULTI-BAND OPERATION

(71) Applicant: TELEFONAKTIEBOLAGET LM ERICSSON (PUBL), Stockholm (SE)

(72) Inventors: Yuanjun Xu, Solna (SE); Bo Göransson, Sollentuna (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 668 days.

(21) Appl. No.: 17/056,540

(22) PCT Filed: Jun. 19, 2018

(86) PCT No.: PCT/SE2018/050655
§ 371 (c)(1),
(2) Date: Nov. 18, 2020

(87) PCT Pub. No.: WO2019/245415
PCT Pub. Date: Dec. 26, 2019

(65) Prior Publication Data
US 2021/0211265 A1    Jul. 8, 2021

(51) Int. Cl.
*H04B 1/40*    (2015.01)
*H03F 3/24*    (2006.01)
(Continued)

(52) U.S. Cl.
CPC ........... *H04B 1/0458* (2013.01); *H03F 3/245* (2013.01); *H03F 2200/451* (2013.01)

(58) Field of Classification Search
CPC ...... H04B 1/04; H04B 1/0458; H04B 1/0475; H04B 1/0483; H04B 1/40; H04B 1/401;
(Continued)

(56) References Cited

U.S. PATENT DOCUMENTS 8,155,037 B2 * 4/2012 Kasai .................. H04B 1/44
370/310
9,780,817 B2 * 10/2017 Scott .................. H04B 1/0475
(Continued)

FOREIGN PATENT DOCUMENTS

CN    102917460 A    2/2013
CN    204013568 U    12/2014
(Continued)

OTHER PUBLICATIONS

Supplementary European Search Report received in related/corresponding EP Application No. 18923632, dated Nov. 26, 2021.
(Continued)

*Primary Examiner* — Quochien B Vuong
(74) *Attorney, Agent, or Firm* — PATENT PORTFOLIO BUILDERS PLLC

(57) ABSTRACT

A radio unit for TDD multi-band operation in a wireless communication system is disclosed. The radio unit comprises a transmitting power amplifier for multi-band operation; one or more receiving amplifiers for multi-band operation and an antenna element. The radio unit further comprises one or more switch networks coupled in parallel between the power amplifier and the antenna element. Each of the one or more switch networks comprises one or more shunt switches coupled between an output of the transmitting power amplifier and a signal ground. Each of the one or more switch networks is configured to operate at a certain frequency band in transmitting or receiving mode and is controlled separately by a switching control unit based on un-synchronized TDD time slots configured according to user data traffic scheduling requirements.

7 Claims, 6 Drawing Sheets

(51) Int. Cl.
  *H04B 1/04* (2006.01)
  *H04L 5/14* (2006.01)
(58) Field of Classification Search
  CPC . H04B 1/406; H04B 1/16; H04B 1/44; H04B 1/50; H04B 1/54; H04B 1/56; H04W 88/00; H04W 88/02; H04W 88/06; H03F 3/20; H03F 3/24; H03F 3/245; H03F 2200/451; H04L 5/14; H04L 5/1461; H04L 5/1469
  See application file for complete search history.

(56) References Cited

U.S. PATENT DOCUMENTS

| | | | |
|---|---|---|---|
| 10,056,875 B1* | 8/2018 | Beaudin | H03F 3/245 |
| 10,727,894 B2* | 7/2020 | Thompson | H04B 1/44 |
| 2003/0193923 A1 | 10/2003 | Abdelgany et al. | |
| 2007/0262829 A1 | 11/2007 | Chominski | |
| 2013/0028600 A1 | 1/2013 | Chang et al. | |
| 2018/0152947 A1 | 5/2018 | Wang et al. | |

FOREIGN PATENT DOCUMENTS

| | | |
|---|---|---|
| CN | 204156841 U | 2/2015 |
| CN | 102246442 B | 2/2016 |
| JP | 2000091943 A | 3/2000 |
| JP | 2001523905 A | 11/2001 |
| JP | 2002171194 A | 6/2002 |
| JP | 2004015688 A | 1/2004 |
| JP | 2004312363 A | 11/2004 |
| JP | 2012509032 A | 4/2012 |
| KR | 20060088255 A | 8/2006 |
| KR | 20080106942 A | 12/2008 |
| WO | 9926309 A1 | 5/1999 |
| WO | 2007100864 A2 | 9/2007 |
| WO | 2010057008 A1 | 5/2010 |
| WO | 2010075656 A1 | 7/2010 |
| WO | 2017189426 A1 | 11/2017 |

OTHER PUBLICATIONS

Office Action in related/corresponding Korean Application No. 2020-7036112 dated Nov. 21, 2022.
Office Action Notice of Reasons for Rejection received in related Japanese Patent Application No. 2020-570175 dated Feb. 22, 2022.
Summary of the Notice of Preliminary Rejection received in related Korean Patent Application No. 2020-7036112 dated Jan. 13, 2022.
International Search Report/Written Opinion dated Apr. 16, 2019 in related/corresponding PCT Application No. PCT/SE2018/050655.
Technical Report, 3GPP TR 37.812 V11.3.0, 3rd Generation Partnership Project; Technical Specification Group Radio Access Network; Radio Frequency (RF) requirements for Multi-band and Multi-standard radio (MB-MSR) Base Station (BS) Release 11, Mar. 2014, pp. 1-42.
Decision to Grant a Patent in corresponding/related Japanese Application No. 2020-570175 dated Oct. 4, 2022.

* cited by examiner

RADIO UNIT FOR UNSYNCHRONIZED TDD MULTI-BAND OPERATION

TECHNICAL FIELD

Embodiments herein relate to a radio unit for un-synchronized Time Division Duplex (TDD) multi-band operation in a wireless communication system. In particular, the embodiments herein relate to a radio unit comprising multiple switch networks controlled separately for un-synchronized TDD multi-band operation and/or Frequency Division Duplex (FDD) operation, radio apparatus or electronic apparatus comprising said radio unit.

BACKGROUND

TDD multi-band operation will be a key radio access technology for the next or $5^{th}$ generation (5G) radio system, especially for high frequency band operation. Using one common radio hardware to support multi-band operation is a key enabler for 5G market, both for User Equipment (UE) and base stations. With beamforming feature, Printed Circuit Board (PCB) size is very important, especially for base stations. How to make 64, 128, 256 . . . antenna elements in a constrained physical space is a great challenge for product designers. Further, the total Bill of Materials (BOM) is also a very important factor compared with the existing radio standard.

Currently, in a receiver chain, wideband Low Noise Amplifier (LNA) and other Radio Frequency (RF) gain blocks are available. For an RF transmission chain, Digital to Analog Converter (DAC) sample rate is high enough to support above 500 MHz bandwidth. With enhancement of Power Amplifier (PA) transistor, it is possible to use one PA to amplify multi-band RF signals. Inherently for a TDD system, the PA must be shut off during time slots when the receiver chain is active. If using one PA to support multi TDD frequency bands, this will force all radio units for different frequency bands to have the same Uplink/Downlink (UL/DL) TDD switch timing. This limits radio resource management for the whole system. For lots of applications, the operator wants to have different UL/DL configurations to optimize different traffic model.

Flexible TDD UL/DL scheduling is a key feature for on coming 5G New Radio (NR). To reduce the total end to end network latency, the 3rd Generation Partnership Project (3GPP) defined a lot of specifications to shorten TDD frames and also time slots. That includes flexible or scalable numerology, e.g. sub-carrier spacing, Cyclic Prefix (CP), with various data rate and mobility, to reduce the latency for different use cases and increase reliability. 5G NR will support flexible Time Transmission Interval (TTI). The TTI control is designed for Quality of Service (QoS) and TTI requirements imposed by the upper service layer(s). This means different frequency bands will have different UL/DL time switch points.

If different frequency bands have different UL/DL time slot configurations, these frequency bands are so called un-synched TDD bands. Currently there is no good solution to handle un-synched TDD bands by sharing the same PA and LNA hardware.

Except the problem of having different TDD slot configurations for two carriers in the same radio unit, there is also a problem with combining FDD and TDD in the same radio unit. The reason is that transmitter signals will leak into the receiver chain and hence cause blocking or desensitization of the receiver circuit. The transmitted signal in one carrier will not be confined into this carrier but also leak into neighboring carriers or frequency bands due to impairments in the transmitter circuits. Normally, this leakage is much smaller than the transmitted signal, but the leakage may still be large compared to a weak signal potentially received by the receiver. This problem exists in both UE and radio base station.

Hence, without special and expensive measures it will not be possible to support TDD and FDD operations at the same time with the same hardware and support different DL/UL time slot configurations for different frequency bands.

SUMMARY

It is an object of embodiments herein to provide a radio unit which can support un-synchronized TDD multi-band operation in a wireless communication system.

According to one aspect of embodiments herein, the object is achieved by a radio unit for un-synchronized TDD multi-band operation in a wireless communication system. The radio unit comprises a transmitting power amplifier for multi-band operation. The radio unit further comprises one or more receiving amplifiers for multi-band operation. The radio unit further comprises an antenna element. The radio unit further comprises one or more switch networks coupled in parallel between the power amplifier and the antenna element. Each of the one or more switch networks comprises one or more shunt switches coupled between an output of the transmitting power amplifier and a signal ground. Each of the one or more switch networks is configured to operate at a certain frequency band in transmitting or receiving mode. Each of the one or more switch networks is controlled separately by a switching control unit based on un-synchronized TDD time slots configured according to user data traffic scheduling requirements such that when operating in transmitting mode, the switch network is controlled to couple the power amplifier to the antenna element and dis-couple one of the one or more receiving amplifiers from the antenna element; and when operating in receiving mode, the switch network is controlled to couple one of the one or more receiving amplifiers to the antenna element and dis-couple the power amplifier from the antenna element.

According to one aspect of embodiments herein, the object is achieved by a radio apparatus or an electronic apparatus, comprising one or more radio units described above. The radio or electronic apparatus may be a radio base station or a wireless communication device for a cellular communication system.

In other words, according to the embodiments herein, the one or more switch networks are configured with its respective selected frequency band. That means, for each frequency band the switch network operating mode may be controlled separately. So for each frequency band, the switch network can have its own TDD time slot configurations. For the whole radio unit, it can run TDD multiband with flexible UL/DL configurations. Further, as the one or more switch networks are controlled by a switching control unit based on un-synchronized TDD time slots configured according to user data traffic scheduling requirements, the TDD time slot may be configured dynamically according to the user data traffic scheduling requirements. This means that the radio unit according to embodiments herein can also support flexible TTI with multi bands operation.

The radio unit according to the embodiments herein enables different frequency bands to share the same hardware; especially the PA may be shared for all supported frequency bands. This means different frequency bands may share the whole PA output power capacity. The radio unit according to the embodiments herein can also support TDD and FDD operations at the same time with the same hardware. The PA output power may be scheduled per band, this feature is called PA power pooling herein. Due to that all RF signals are amplified in the same PA, different bands may dynamically share the PA output power, whereby the size, weight and cost of the radio or electronic apparatus products using the radio unit may be reduced. Furthermore, the DC power consumption may be reduced as well.

Therefore, the embodiments herein provide a radio unit which can support un-synchronized TDD multi-band operation in a wireless communication system with improved performance on power consumption and reduced cost and size.

BRIEF DESCRIPTION OF THE DRAWINGS

Solutions of embodiments herein are described in more detail with reference to attached drawings in which.

DETAILED DESCRIPTION

Figure 1:
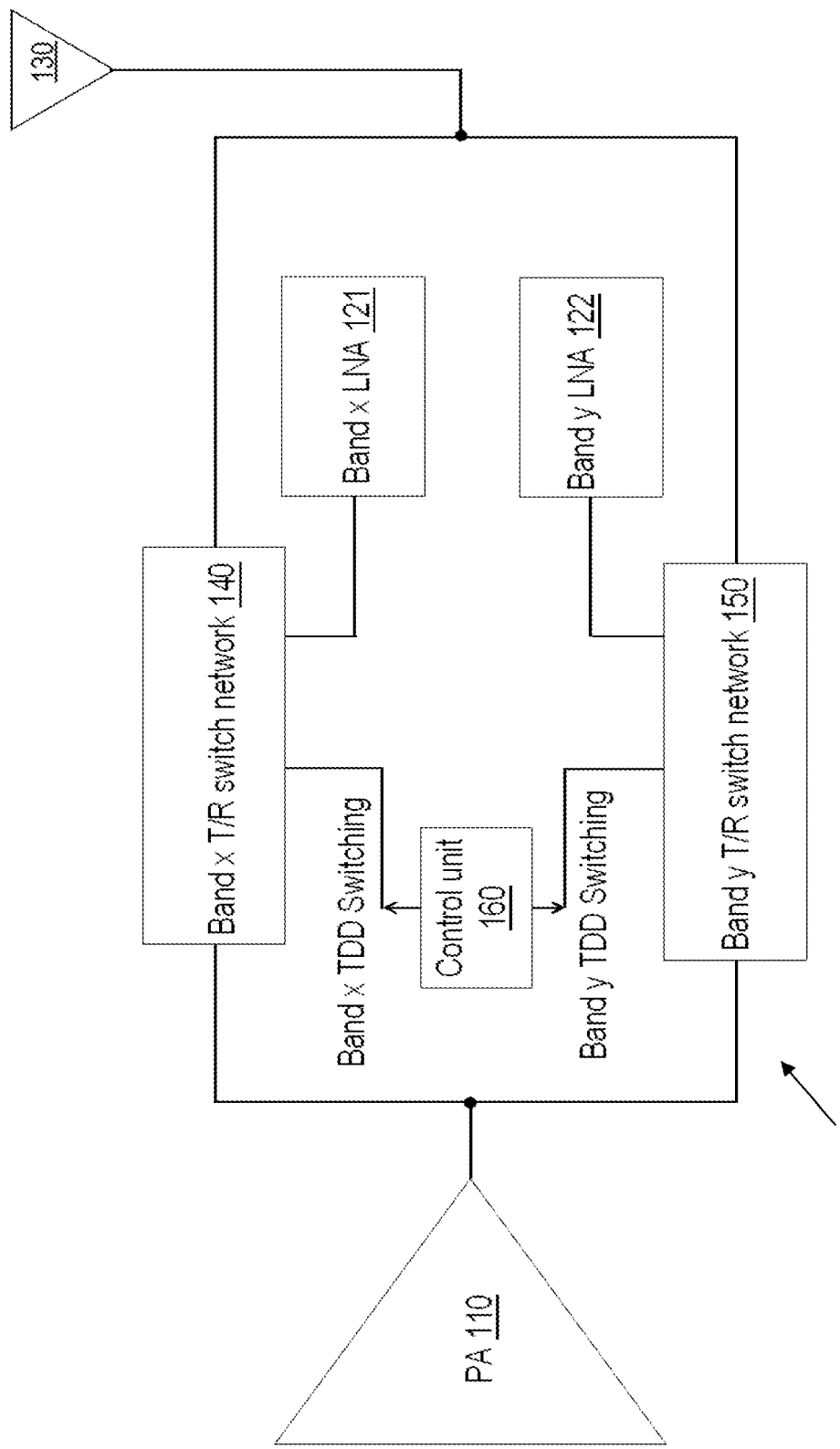
FIG. 1 is a general schematic block diagram illustrating a radio unit according to embodiments herein.

FIG. 1 shows a radio unit 100 according to embodiments herein for un-synchronized TDD multi-band operation in a wireless communication system. As illustrated in FIG. 1, the radio unit 100 comprises a transmitting power amplifier PA 110, e.g. a multiband RF or wide band PA for multi-band operation; one or more receiving amplifiers LNA 121, 122 for multi-band operation and an antenna element 130.

The radio unit 100 further comprises one or more switch networks coupled in parallel between the power amplifier 110 and the antenna element 130, such as a first switch network, Band x T/R switch network 140, for operating at a first frequency band x in transmitting or receiving mode, a second switch network, Band y T/R switch network 150, for operating at a second frequency band y in transmitting or receiving mode.

Each of the one or more switch networks 140, 150 is controlled separately by a switching control unit 160 based on un-synchronized TDD time slots configured according to user data traffic scheduling requirements. For example, if a user watches on line film, this user needs higher DL band width than UL band width, thus more DL time slots may be assigned to this user compared with a normal voice call user. The switching control unit 160 then controls the one or more switch networks 140, 150 operating in transmitting or receiving mode based on the assigned time slots for DL/UL.

FIG. 1 gives one example for two frequency bands, e.g. the first band x and the second band y. However there is no limit on how many frequency bands can be supported according to the embodiments herein as long as the PA 110 can handle them.

Figure 2:
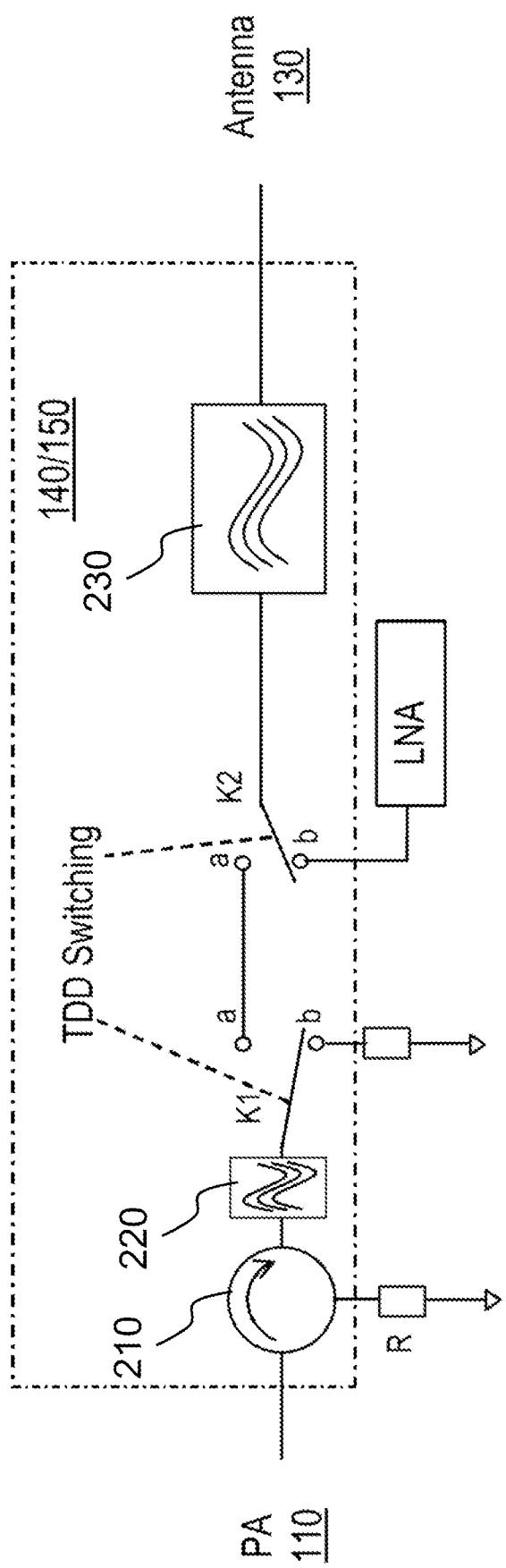
FIG. 2 is a functional block diagram of a switch network according to embodiments herein.

FIG. 2 is a functional block diagram of the switch network 140/150 to illustrate how the switch network 140/150 is controlled according to its operating mode. The switch network 140/150 comprises a chain of functional blocks such as a circulator 210, a first filter 220, switches K1, K2 and a second filter 230. Any one of the switches K1, K2 may be implemented by common RF switches, such as P-Intrinsic-N (PIN) diode, RF Gallium Nitride (GaN), and any other RF switches not limited to semiconductor technology.

When operating in transmitting mode, the switch network 140/150 is controlled to couple the power amplifier PA 110 to the antenna element 130 and dis-couple its receiving amplifier LNA from the antenna element 130. That is K1 and K2 are switched to point a.

When operating in receiving mode, the switch network 140/150 is controlled to couple its receiving amplifiers LNA to the antenna element 130 and dis-couple the power amplifier PA 110 from the antenna element 130. That is switches K1 and K2 are switched to point b.

Therefore each of the first and second switch networks 140/150 has two operating modes during its operation, i.e. transmitting mode and receiving mode. Each of the switch networks 140/150 is designed or configured with its respective selected frequency. That means, the switch network 140/150 only do the transmitting and receiving switching for its own frequency band, and will not impact on other frequency bands. In each frequency band, when the switching network 140/150 works in transmitting mode, it distributes an RF signal from the wide band PA 110 to the antenna element 130. At the same time, it can give enough isolation to its LNA by dis-coupling its LNA from the antenna element 130. In this way, the LNA is protected; otherwise the LNA may be damaged by its transmitting signal.

The switch control must be synchronized with its baseband In-phase and Quadrature (IQ) data, i.e. when the band x switch to receiving mode, the band y transmitting baseband IQ data must be padded with zero, i.e. IQ switch off. In the frequency domain, there is no real transmitting traffic output during the receiving time slot which is given by TDD system operation protocol.

FIG. 2 only gives the functional blocks of the switch network 140/150 and does not represent any real hardware implementation. The hardware design may make a trade-off on key design parameters, such as isolation level, power handing, frequency selectivity etc. So the same functional block may be implemented by different hardware variants. Some functional blocks may be merged into one hardware block, such as the first or second filter 220, 230 and the RF switch K1, K2 may be combined into one block. The position of the functional block may be moved inside the chain, such as the PA circulator 210 may be moved close to K2.

Figure 3:
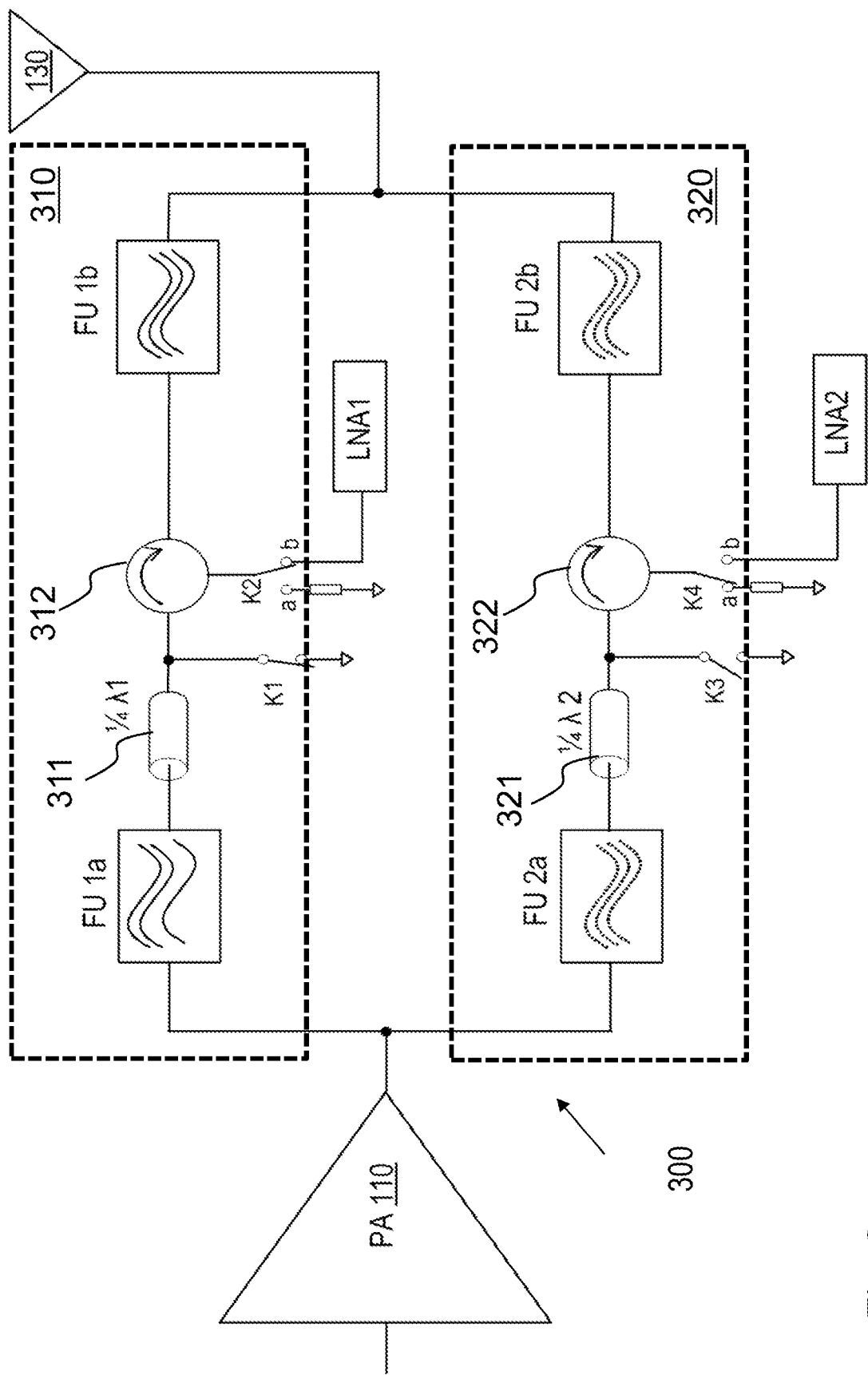
FIG. 3 is a schematic block diagram illustrating a radio unit according to embodiments herein.

FIG. 3 shows one example embodiment of a radio unit 300 with RF Transmitting/Receiving (T/R) switch networks for un-synchronized TDD multi-band operation. As show in FIG. 3, the radio unit 300 comprises a first switch network 310 and a second switch network 320.

To meet the RF spectrum specification, the switch network 310, 320 may include some RF filters, such as cavity filters, to protect the PA 110. According to some embodiments herein, an RF circulator may be embedded into the switch network 310, 320 as well. When the switch network 310, 320 operates in the receiving mode, the received RF signal from the antenna 130 is forwarded to its LNA. At the same time, the T/R switch network 310, 320 blocks all RF signals from the wide band PA 110 to its LNA. This makes sure the LNA performance will not get any visible degradation from the PA output. The output from the PA 110 may be PA noise floor, PA nonlinear products, the PA output signal from all other RF bands etc. Normally the PA output noise floor is much higher than the LNA input noise, to further reduce the PA output signal leakage into LNA circuit during the receiving e.g., uplink time slot, inside the T/R switch network 310, 320, it may include additional filter chain, e.g. cavity filters or other RF filters. This will help increase the isolation between PA 110 and the LNA circuit. Some high isolation RF analog switches may be used also. From the LNA point of view, the T/R switch network 310, 320 will do RF mute function for PA 110 during the receiving time slot.

Therefore each of the switch networks 310, 320 may comprise a first filter, e.g. a cavity filter FU1a, FU2a cascaded with a one quarter wavelength transmission line 311, 321. Each of the switch networks 310, 320 may comprises a circulator 312, 322 which gives directional isolation between the PA 110 and the antenna 130. In this embodiment, RF switches K1, K2, K3 and K4 may be implemented based on PIN diodes, GaN or any other RF switches not limited to semiconductor technology. Thus K1 and K3 may be shunt PIN diode switches, K2 and K4 may be any RF multiplexer (MUX) switches implemented by any known technology.

As mentioned above, the PA 110 output noise floor is much higher than the LNA input noise. To further reduce the PA output noise floor, the shunt RF switches K1 and K3 in FIG. 3 will mute most of RF leakage signals that come from the PA 110 during the receiving timeslot.

Figure 4:
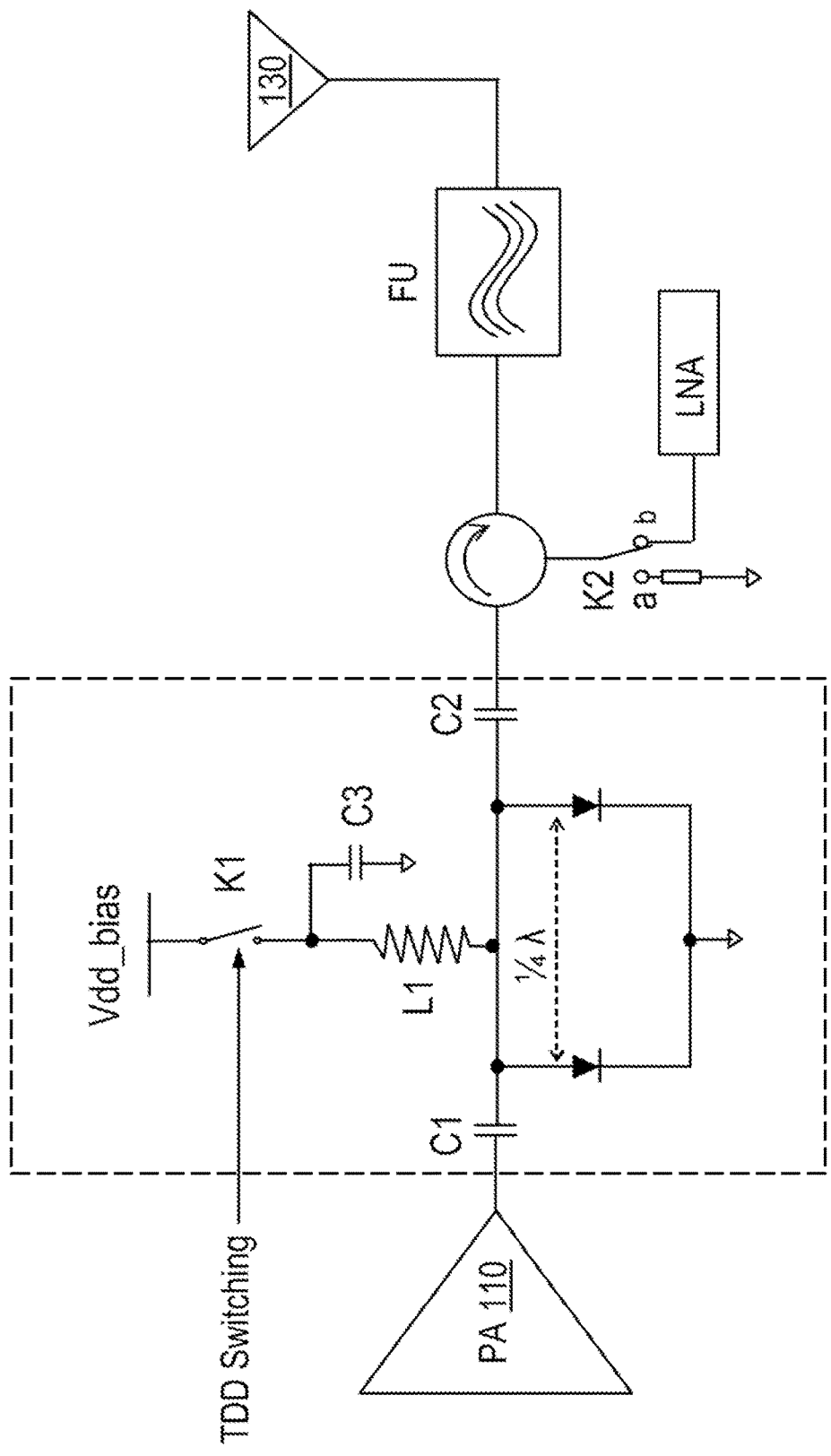
FIG. 4 is a schematic block diagram illustrating a switch network using RF PIN diode according to embodiments herein.

The switches K1, K3 may be implemented by a PIN diode switch. FIG. 4 is a schematic view showing a part of the switch network 140, 150, 310, 320 of FIG. 1 and/or FIG. 3, where the shunt switch K1 is implemented with PIN diodes, a so called shunt PIN diode switch. Capacitors C1 and C2 are direct current (DC) decoupling capacitors to block DC signal while passing RF signal. Inductor L1 and capacitor C3 work as RF choke to block high frequency or RF signal while passing DC signal. Vdd_bias is DC bias to the PIN diodes. When the switch K1 is turned on, two PIN diodes have positive bias and will couple the output of the PA 110 to the ground. Therefore according to the embodiments herein, each of the one or more switch networks 140, 150, 310, 320 comprises one or more shunt switches K1, K3, based on e.g. PIN diode. Depending on RF power handing, normally high power handing RF switches have higher insertion loss, e.g. about 0.5 to 2 dB. Using a RF shunt PIN diode switch, the insertion loss may be reduced to, e.g. 0.2 dB to 0.3 dB.

The radio unit 100, 300 according to the embodiments herein can achieve high isolation between the transmitting and receiving for the same TDD band. For example, during DL time slot at the first band x, i.e. when operating in transmitting mode, switch K2 is on its position a, switch K1 is off, the PA 110 output RF signal can pass its circulator and its filters to the antenna 130. During the UL time slot, i.e. when operating in receiving mode, switch K2 is on its position b, LNA is activated, and switch K1 is on. Since the timeslot is UL now, there is no DL traffic, the PA output on this band will stay in the noise floor level. Since switch K1 is on, all PA noise will be muted to the ground. So the LNA will not receive its in-band PA noise. Switches K3 and K4 of the second band (y) are operated similarly as the corresponding switches K1 and K2 during the DL and UL time slot, respectively, of the second band. Normally, single PIN diode switch may get about 30 dB isolation at around 4 GHz. To achieve the band isolation target, adding another shunt RF switch in parallel with K1 and K3, respectively, or adding a serial RF switch between FU1a and circulator 312, a serial RF switch between FU2a and circulator 322, will increase the isolations. Normally, increasing the isolation, will increase the insertion loss. This will require the PA 110 have higher output power. In real applications, design tradeoffs may be made to balance between the isolation and the insertion loss.

Isolation for different TDD bands may be achieved by filters FU1b and FU2b. For different bands working at different UL/DL configurations, as in FDD operation, UL and DL are working at the same time. In FDD operation, one cavity filter for transmitting and another cavity filter for receiving. With reasonable design efforts and cost, the isolation for different TDD bands may be above 100 dB to 130 dB, which is at the same level as FDD cavity filters. In this way, filters FU1a and FU2a may be designed using very relaxed specifications, since they only give the PA 110 load isolation for each band, 20 dB-30 dB isolation may be enough.

As mentioned before, the T/R switch network is designed with selected frequency band. That means for each frequency band, the T/R switch network 140, 150, 310, 320 operating mode can be controlled separately. So for each frequency band, it can have its own TDD time slot configurations. For the whole radio unit, it can run TDD multiband with flexible UL/DL configurations.

Figure 5:
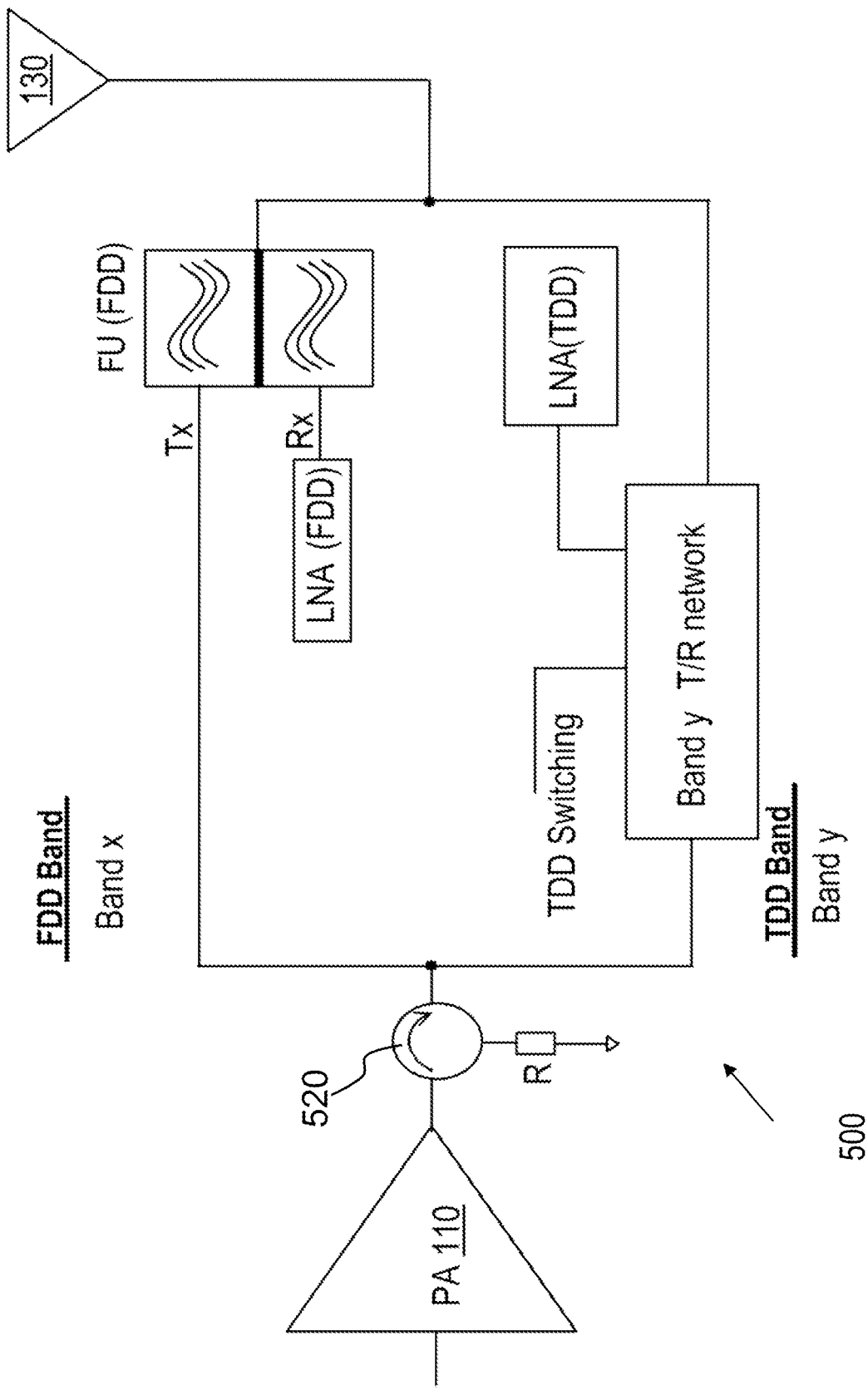
FIG. 5 is a schematic block diagram illustrating a radio unit with combined FDD and TDD operation according to embodiments herein.

The radio unit 100, 300 according to embodiments herein may be used for FDD operation also, i.e. the FDD and TDD operation may be combined in one radio unit. FIG. 5 shows one example radio unit 500, where one of TDD frequency band, e.g. Band y and one of FDD frequency band, e.g. Band x, may be supported by the same product using the same hardware. Based on this solution, more frequency bands may be combined, both FDD band(s) and TDD band(s). Therefore according to some embodiments herein, the radio unit 100, 300, 500 may comprise one or more transmitting-receiving paths coupled in parallel with the one or more switch networks 140, 150. Each of the one or more transmitting-receiving paths may be configured for FDD operation in a certain frequency band.

As shown in FIG. 5, the radio unit 500 comprises a FDD transmitting-receiving path coupled in parallel with a T/R switch network operating in TDD mode. The radio unit 500 may comprise a wide band circulator 520 which can support both FDD frequency bands and TDD frequency bands. If the circulator 520 bandwidth is too small, two circulators before each band cavity filter, e.g. FU (FDD), may be added. So each circulator only supports its own band(s). Compared with a traditional FDD radio hardware, some advantages with the embodiments herein are that FDD and TDD operations may share the same RF PA for transmitting, and in the receiving direction, the LNA and the rest of receiving chain may be shared also. This will further reduce the total hardware cost. So if the LNA can handle both FDD and TDD operational frequency bands at same time, the LNA may be shared also, although shown in FIG. 5 that LNA is not shared between FDD and TDD frequency band.

Therefore, according some embodiments herein, any two or more switch networks 140, 150, 310, 320 and/or one or more FDD transmitting-receiving paths may share one receiving amplifier.

Figure 6:
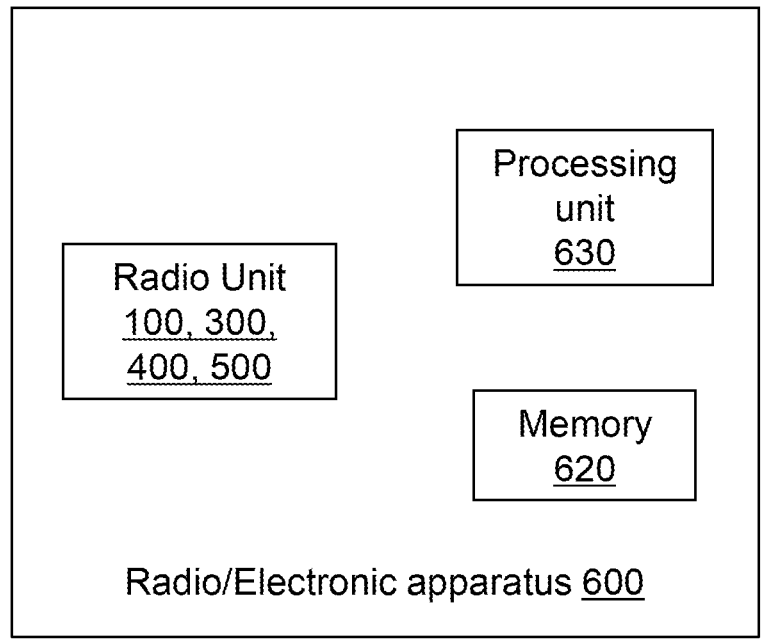
FIG. 6 is a block diagram illustrating a radio or electronic apparatus in which embodiments herein may be implemented.

The radio unit 100, 300, 500 according to the embodiments herein may be employed in various radio or electronic apparatuses. FIG. 6 shows a block diagram for a radio or electronic apparatus 600. The radio or electronic apparatus 600 comprises one or more radio unit 100, 300, 500. The radio or electronic apparatus 600 may be a radio base station or a wireless communication device, e.g. a user equipment or a mobile device for a cellular communications system/network. The radio or electronic apparatus 600 may comprise other units, where a memory 620, a processing unit 630 are shown.

Those skilled in the art will understand that the radio unit 100, 300, 500 according to embodiments herein may be implemented by any technology not limited by semiconductor.

When using the word "comprise" or "comprising" it shall be interpreted as non-limiting, i.e. meaning "consist at least of".

The embodiments herein are not limited to the above described preferred embodiments. Various alternatives, modifications and equivalents may be used. Therefore, the above embodiments should not be taken as limiting the scope of the invention, which is defined by the appended claims.

The invention claimed is:

1. A radio unit for un-synchronized Time Division Duplex, TDD, multi-band operation in a wireless communication system, the radio unit comprising:
a transmitting power amplifier for multi-band operation;
one or more receiving amplifiers for multi-band operation;
an antenna element; and
two or more switch networks coupled in parallel between the transmitting power amplifier and the antenna element and comprising a first filter, a circulator and a second filter;
wherein
each of the two or more switch networks comprises a shunt switch coupled between an output of the first filter and a signal ground;
each of the two or more switch networks is configured to operate at a certain frequency band in transmitting or receiving mode and is controlled separately by a switching control unit based on un-synchronized TDD time slots configured according to user data traffic scheduling requirements such that
when operating in transmitting mode, the switch network is controlled to couple the transmitting power amplifier via the first filter, the circulator, and the second filter, to the antenna element and dis-couple one of the one or more receiving amplifiers from the antenna element; and
when operating in receiving mode, the switch network is controlled to couple one of the one or more receiving amplifiers to the antenna element via the second filter and the circulator, and dis-couple the transmitting power amplifier from the antenna element by coupling said shunt switch to the signal ground.

2. The radio unit according to claim 1, wherein the first filter in any one of the two or more switch networks is cascaded with a quarter wavelength transmission line and the circulator, wherein any one of the two or more switch networks further comprises a Single pole, double throw, SPDT, switch, wherein the shunt switch is a PIN diode and is connected between the signal ground and an interconnection of the quarter wavelength transmission line and the circulator, the SPDT switch is connected between the circulator and one of the receiving amplifiers.

3. The radio unit according to claim 1, further comprising two or more transmitting-receiving paths coupled in parallel with the two or more switch networks, and each of the two or more transmitting-receiving paths is configured for Frequency Division Duplex, FDD, operation in a certain frequency band.

4. The radio unit according to claim 1, wherein any two or more switch networks and/or FDD transmitting-receiving paths share one receiving amplifier.

5. A radio apparatus comprising one or more radio units according to claim 1.

6. An electronic apparatus comprising one or more radio units according to claim 1.

7. The electronic apparatus according to claim 6, wherein the electronic apparatus is a radio base station or a wireless communication device for a cellular communication system.

* * * * *